United States Patent
Ding et al.

(10) Patent No.: US 7,605,606 B1
(45) Date of Patent: Oct. 20, 2009

(54) AREA EFFICIENT ROUTING ARCHITECTURES FOR PROGRAMMABLE LOGIC DEVICES

(75) Inventors: Ming H. Ding, San Jose, CA (US); Sajitha Wijesuriya, Macungie, PA (US); Jun Zhao, Allentown, PA (US); Om P. Agrawal, Los Altos, CA (US); Barry Britton, Orefield, PA (US); Xiaojie He, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 78 days.

(21) Appl. No.: 11/498,646

(22) Filed: Aug. 3, 2006

(51) Int. Cl.
*H03K 19/177* (2006.01)
(52) U.S. Cl. .......................... 326/41; 326/38
(58) Field of Classification Search ............. 326/37–41, 326/47
See application file for complete search history.

(56) References Cited

U.S. PATENT DOCUMENTS

| | | | | |
|---|---|---|---|---|
| 6,462,577 B1 * | 10/2002 | Lee et al. | ...................... | 326/40 |
| 6,864,713 B1 * | 3/2005 | Agrawal et al. | ............... | 326/41 |
| 6,970,012 B2 * | 11/2005 | Crotty et al. | .................. | 326/40 |
| 7,000,212 B2 * | 2/2006 | Agrawal et al. | ............... | 716/17 |
| 7,187,199 B1 * | 3/2007 | Lai | .............................. | 326/38 |

OTHER PUBLICATIONS

U.S. Appl. No. 11/445,620, filed Jun. 2, 2006, Agrawal et al.
U.S. Appl. No. 11/446,351, filed Jun. 2, 2006, Agrawal et al.
U.S. Appl. No. 11/446,542, filed Jun. 2, 2006, Agrawal et al.
Altera, Section 1, Stratix II Device Family Data Sheet, vol. 1, Jan. 2006, 232 pages.
Xilinx, Virtex-4, Family Overview, DS112, (v1.5) Feb. 10, 2006, 9 pages.
Xilinx, Virtex-II Platform FPGAs: Complete Date Sheet, DS031 (v3.4) Mar. 1, 2005, 318 pages.
Lattice Semiconductor Corporation, LatticeECP/EC Family Data Sheet, Version 02.1, Nov. 2005, 159 pages.
Lattice Semiconductor Corporation, Lattice XP Family Data Sheet, Version 04.2, Mar. 2006, 127 pages.
Altera, Section I. Stratix Device Family Data Sheet, vol. 1, Sep. 2004, 276 pages.
Xilinx, Virtex-E 1.8 V, Field Programmable Gate Arrays, DS022-2 (v2.8) Jan. 16, 2006, 54 pages.
Xilinx, Virtex-4, User Guide, UG070 (v1.4) Sep. 12, 2005, 388 pages.
Xilinx, Spartan-3E FPGA Family: Complete Data Sheet, DS312 May 19, 2006, 230 pages.
Xilinx, Spartan-3 FPGA Family: Complete Data Sheet, DS099 Apr. 26, 2006, 206 pages.

* cited by examiner

*Primary Examiner*—Vibol Tan
*Assistant Examiner*—Christopher Lo
(74) *Attorney, Agent, or Firm*—Haynes & Boone, LLP

(57) ABSTRACT

Systems and methods provide programmable logic block architectures and routing architectures for the programmable logic blocks. For example, in accordance with an embodiment of the present invention, a programmable logic device includes a plurality of programmable logic blocks and a plurality of logic block slices within each of the programmable logic blocks. A first routing circuit provides global signal routing within the programmable logic device for the corresponding programmable logic block. A first input routing circuit receives signals from the first routing circuit and routes the signals to the logic block slices within the corresponding programmable logic block.

20 Claims, 8 Drawing Sheets

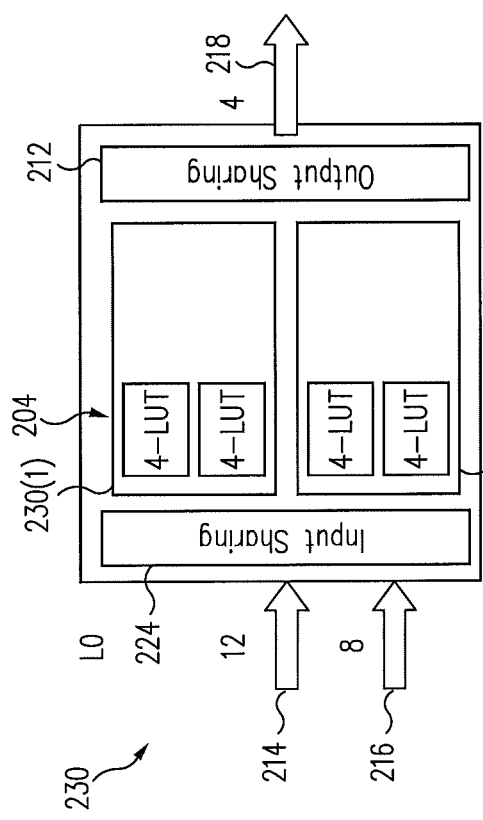
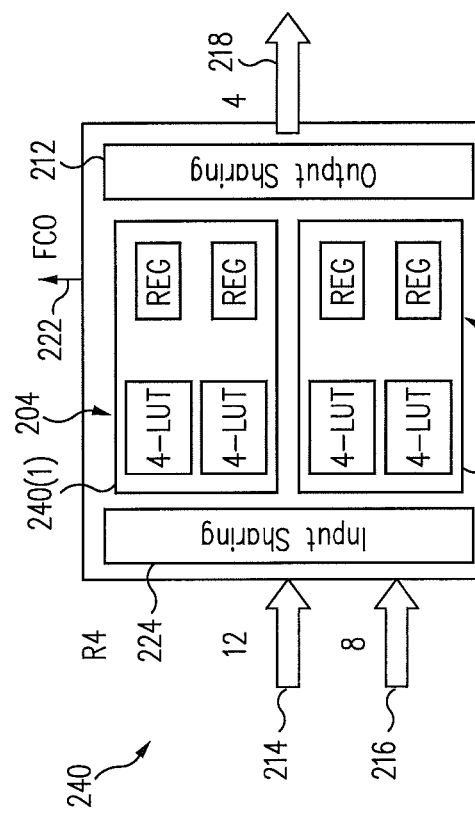
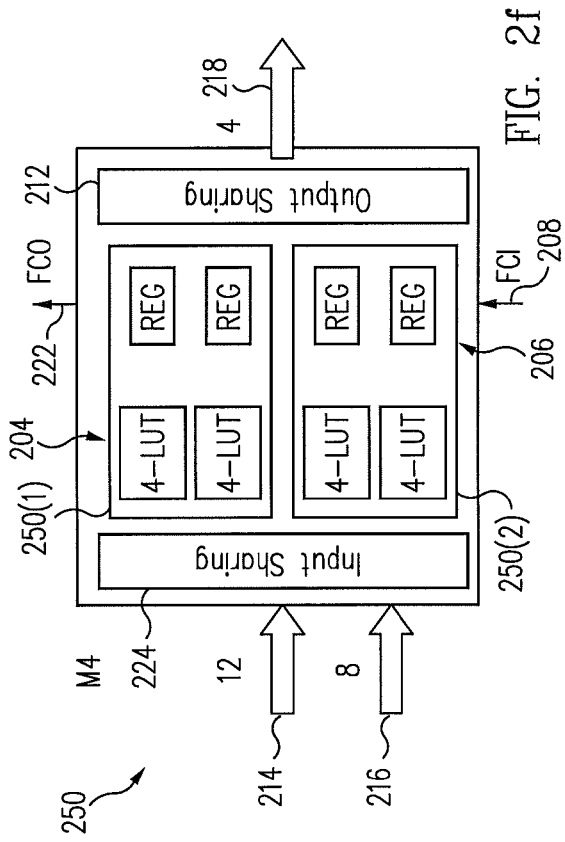
FIG. 2d
FIG. 2e
FIG. 2f

AREA EFFICIENT ROUTING ARCHITECTURES FOR PROGRAMMABLE LOGIC DEVICES

TECHNICAL FIELD

The present invention relates generally to electrical circuits and, more particularly, to programmable logic devices.

BACKGROUND

A typical programmable logic device (PLD) includes a number of programmable logic blocks (e.g., also referred to in the art as configurable logic blocks, logic array blocks, programmable function blocks, or programmable function units). A drawback of the conventional PLD is that the programmable logic block architecture is often not optimized for the desired application. For example, the programmable logic blocks are generally homogeneous with each having the same one or two slices or each having the same block structure (e.g., a number of lookup tables (LUTs) in a single block). Consequently, the programmable logic block architecture is not optimized for the desired application and results in unused resources, larger than necessary die size, and inefficient scaling for providing a larger number of LUTs within the PLD.

Another drawback of the conventional PLD is that the routing architecture (e.g., interconnect) is often optimized for performance on a per-LUT basis for its input/output ports. Consequently, the routing architecture, which may constitute a significant percentage of the die area and affect performance, power dissipation, and overall logic utilization of the PLD, may not be optimized for scalability to higher density PLD sizes in an area efficient manner and provide the desired routing flexibility. As a result, there is a need for improved programmable logic block and routing architectures for PLDs.

SUMMARY

In accordance with one embodiment of the present invention, a programmable logic device includes a plurality of programmable logic blocks; a plurality of logic block slices within each of the programmable logic blocks; a first routing circuit, corresponding to each programmable logic block, adapted to provide global signal routing within the programmable logic device for the corresponding programmable logic block; and a first input routing circuit, corresponding to each programmable logic block, adapted to receive signals from the first routing circuit and route to the plurality of logic block slices within the corresponding programmable logic block.

In accordance with another embodiment of the present invention, a programmable logic device includes a plurality of programmable logic blocks; a plurality of logic block slices within each of the programmable logic blocks; means for globally routing signals within the programmable logic device for the programmable logic blocks; and means, corresponding to each programmable logic block, for routing in a first and a second stage signals from the global routing means to the plurality of logic block slices within the corresponding programmable logic block.

In accordance with another embodiment of the present invention, a method of for providing a routing architecture within a programmable logic device includes providing a plurality of programmable logic blocks; providing at least a first logic block slice, a second logic block slice, and a third logic block slice within each of the programmable logic blocks, with the first, second, and third logic block slices each of a different logic block slice type; providing a first routing circuit for each programmable logic block to route signals within the programmable logic device locally for the programmable logic block and to other ones of the programmable logic blocks; and providing a two-stage routing circuit for each programmable logic block for routing signals from the first routing circuit to the logic block slices within the corresponding programmable logic block.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 2a-2f show block diagrams illustrating exemplary implementation slice details for the programmable logic device of FIG. 1 in accordance with an embodiment of the present invention.

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
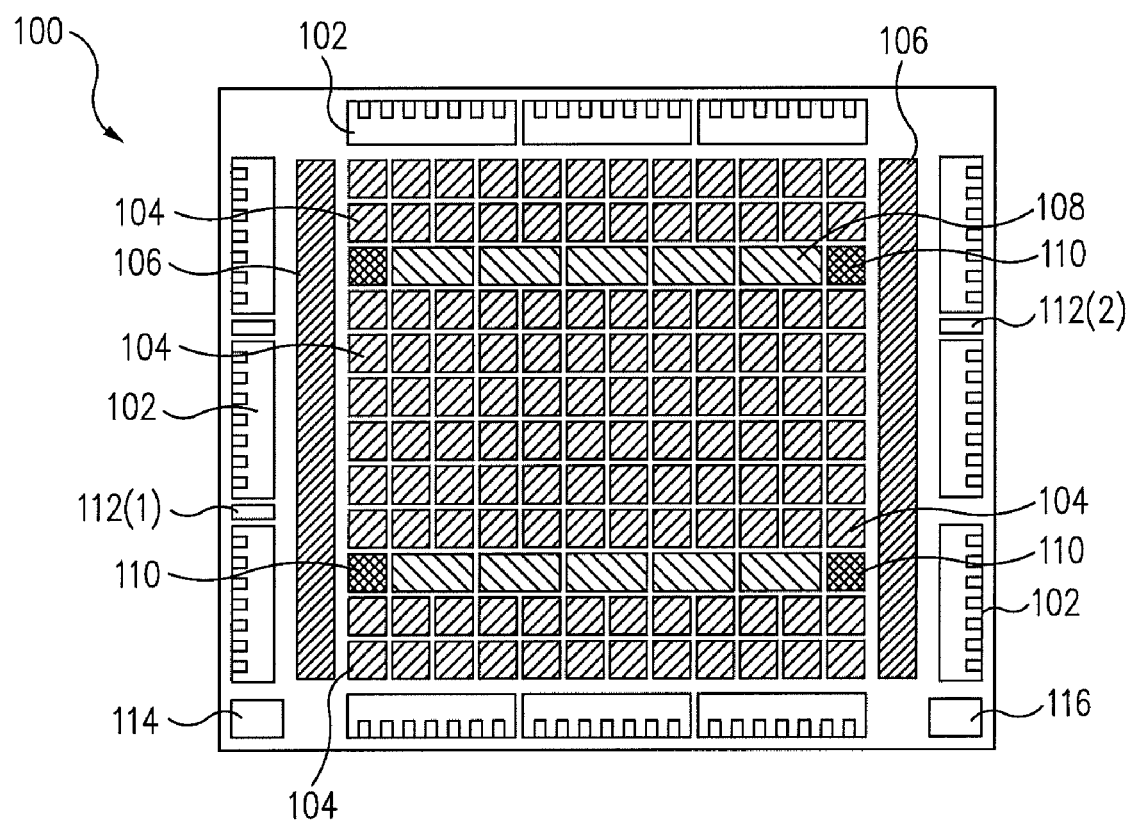
FIG. 1 shows a block diagram illustrating an exemplary programmable logic device in accordance with an embodiment of the present invention.
Figure 2A:
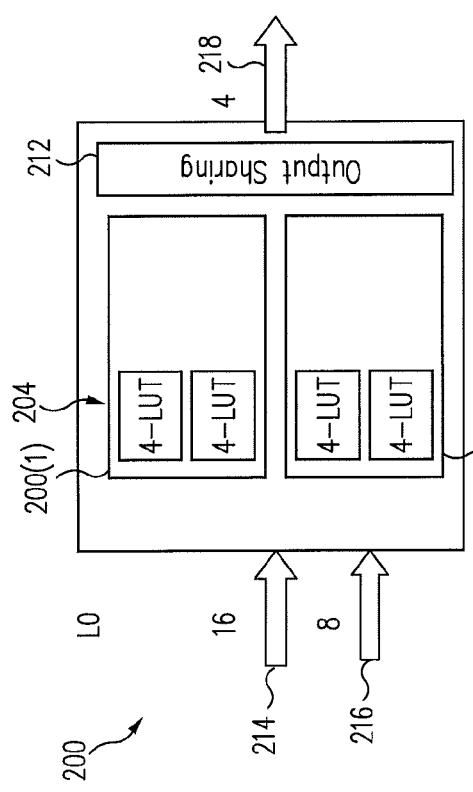
Figure 2B:
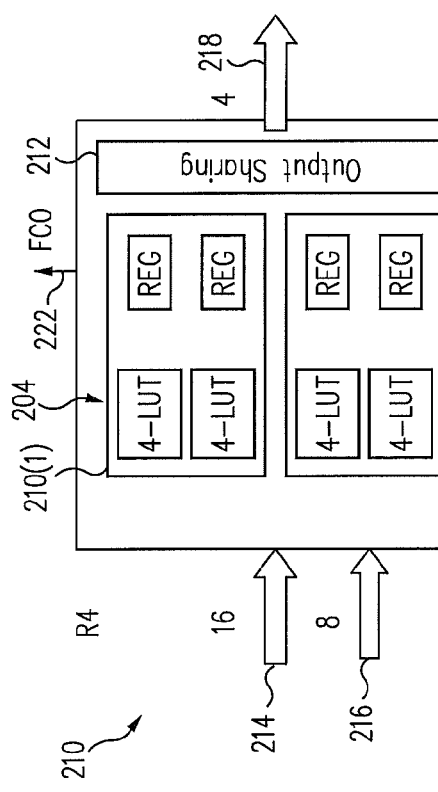
Figure 2C:
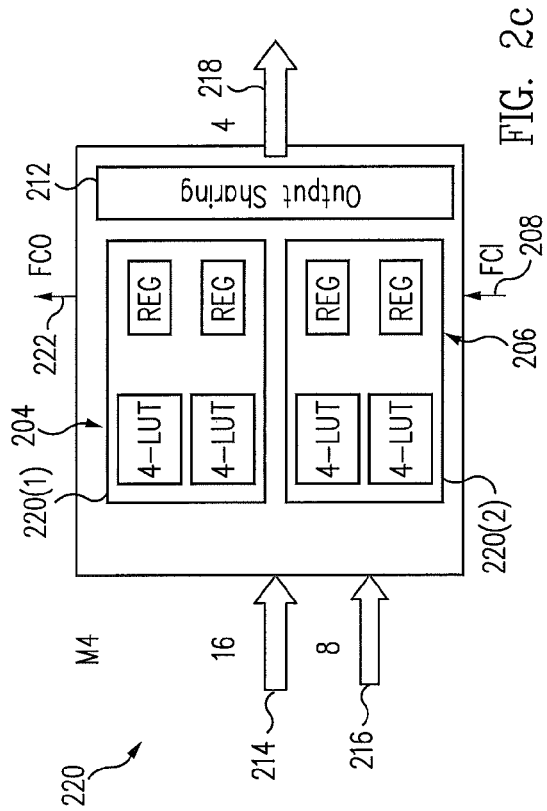
Figure 3A:
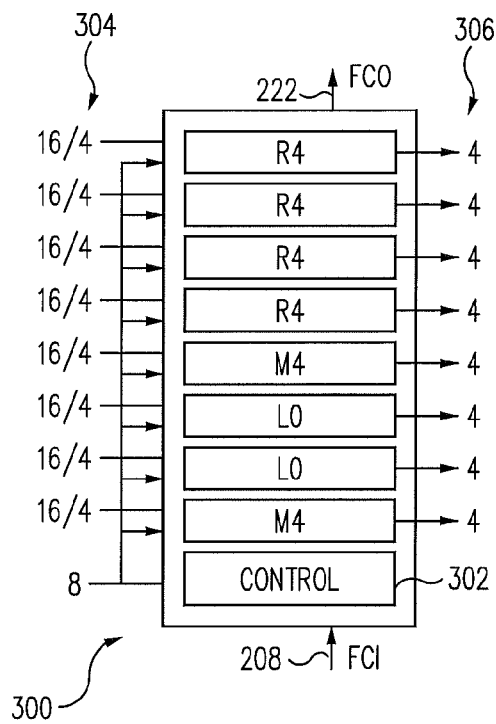
FIGS. 3a-3d show block diagrams illustrating exemplary implementation slice details for a programmable logic block of the programmable logic device of FIG. 1 in accordance with an embodiment of the present invention.
Figure 3B:
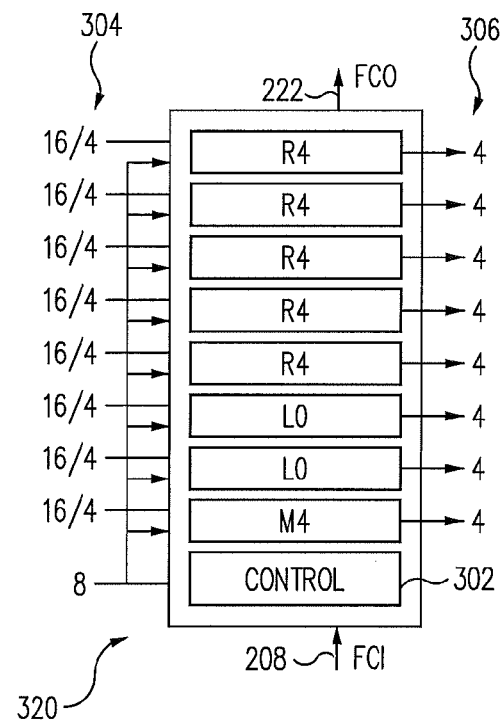
Figure 3C:
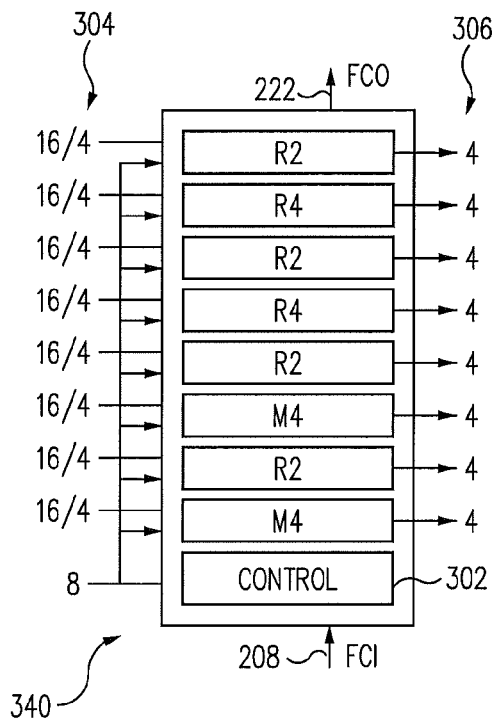
Figure 3D:
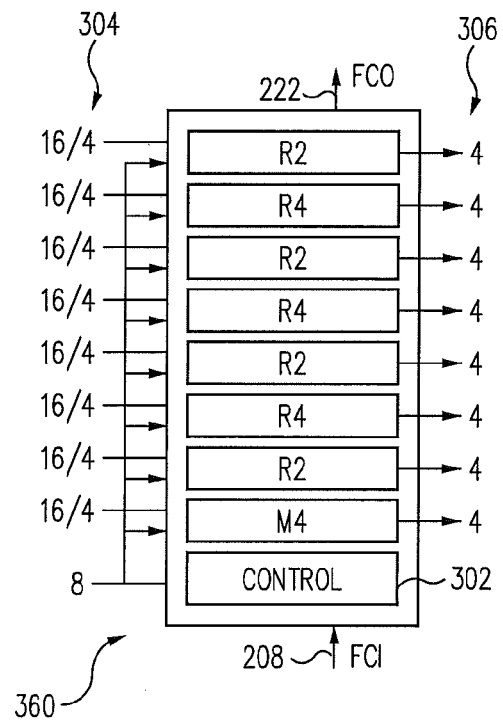

FIG. 1 shows a block diagram illustrating an exemplary programmable logic device (PLD) 100 in accordance with an embodiment of the present invention. PLD 100 (e.g., an FPGA) includes input/output (I/O) blocks 102 and programmable logic blocks 104. I/O blocks 102 provide I/O functionality (e.g., supports one or more I/O and/or memory interface standards) for PLD 100, while programmable logic blocks 104 provide logic functionality (e.g., LUT-based logic) for PLD 100.

PLD 100 may also include reprogrammable non-volatile memory 106 (e.g., blocks of EEPROM or flash memory), volatile memory 108 (e.g., block SRAM), clock-related circuitry 110 (e.g., PLL circuits), one or more data ports 112, configuration memory 114, and/or an interconnect 116. It should be understood that the number and placement of the various elements, such as I/O blocks 102, logic blocks 104, non-volatile memory 106, volatile memory 108, clock-related circuitry 110, data port 112, configuration memory 114, and interconnect 116, is not limiting and may depend upon the desired application. Furthermore, it should be understood that the elements are illustrated in block form for clarity and that certain elements, such as configuration memory 114 and interconnect 116, would typically be distributed throughout PLD 100, such as in and between programmable logic blocks 104, to perform their conventional functions (e.g., storing configuration data that configures PLD 100 and providing routing resources, respectively).

Data port 112 may be used for programming non-volatile memory 106 and/or configuration memory 114 of PLD 100, in accordance with one or more embodiments of the present invention and as would be understood by one skilled in the art. For example, data port 112(1) may represent a programming port such as a central processing unit (CPU) port, also referred to as a peripheral data port or a sysCONFIG programming port. Data port 112(2) may represent, for example, a programming port such as a joint test action group (JTAG) port by employing standards such as Institute of Electrical and Electronics Engineers (IEEE) 1149.1 or 1532 standards. Data ports 112(1) and 112(2) are not both required, but one or the other or both may be included to receive configuration data and commands. Further details regarding programming may be found in U.S. Pat. No. 6,828,823 and U.S. Patent Application Publication No. 2005-0189962-A1, published Sep. 1, 2005.

As noted herein for conventional programmable logic block architectures, a typical programmable logic block is limited to a maximum of one or two types of slices, which may result in an un-optimized programmable logic block structure that wastes valuable resources (e.g., silicon inefficiency, poor utilization, higher costs, and larger die size). In contrast in accordance with one or more embodiments of the present invention, a programmable logic block architecture is disclosed that provides programmable logic blocks having a large number of slices and a mixture of slice types.

For example, in accordance with an embodiment of the present invention, a programmable logic block is disclosed that provides three or more logic block slices, with each logic block slice being different (e.g., in terms of logic, register, and/or memory functionality). Furthermore for this example in accordance with an embodiment of the present invention, the programmable logic blocks within the PLD may be homogeneous (i.e., each programmable logic block having the same type and number of logic block slices) or the programmable logic blocks may differ in terms of the number and/or types of logic block slices provided (e.g., the programmable logic blocks from row to row may differ from each other for one or more rows within PLD 100, where "row" may represent a row, column, or some number of programmable logic blocks).

For example, FIGS. 2a-2f show block diagrams illustrating exemplary implementation details for logic block slices 200, 210, 220, 230, 240, and 250, respectively, for PLD 100 of FIG. 1 in accordance with an embodiment of the present invention. For example, logic block slices 200, 210, and 220 (labeled and also referred to herein as L0, R4, and M4 logic block slices, respectively) may include a number of LUTs 204 (e.g., four of the four-input LUTs, each labeled 4-LUT to provide 64-bits of SRAM) and a routing circuit 212 (e.g., labeled output sharing).

Logic block slices 200, 210, and 220 each receives LUT input signals 214 (e.g., 16 LUT inputs) and control signals 216 (e.g., 8 control signals) and each provides output signals 218 (e.g., 4 output signals). Logic block slices 200, 210, and 220 may further receive other signals, such as multiplexer control signals (e.g., four multiplexer control signals per logic block slice).

Logic block slices 210 and 220 may further include registers 206 (e.g., four of registers 206), while logic block slice 220 may further provide distributed memory capability (e.g., read/write capability for LUTs 204 to provide RAM functionality during user mode of operation), as would be understood by one skilled in the art. Logic block slices 210 and 220 further provide carry in and carry out capability as shown by corresponding carry signals 208 and 222 (e.g., labeled FCI and FCO, respectively, to represent exemplary fast carry in and fast carry out capability), as would also be understood by one skilled in the art.

Logic block slices 200, 210, 220, 230, 240, and 250, in accordance with an embodiment of the present invention, may be viewed as representing a dual-slice architecture. For logic block slice 210 of FIG. 2b, for example, a first slice 210(1) and a second slice 210(2) may each include two LUTs 204 and two registers 206. As another example, for logic block slice 200 of FIG. 2a, a first slice 200(1) and a second slice 200(2) may each include simply two LUTs 204. In accordance with other embodiments of the present invention, logic block slices (e.g., logic block slices 200, 210, 220, 230, 240, and/or 250) may simply be a slice or may include more than two slices.

Logic block slices 200, 210, 220, 230, 240, and 250 represent exemplary slices, as discussed further herein, for implementing a programmable logic block architecture of a PLD in accordance with one or more embodiments of the present invention. However, it should be understood that logic block slices 200, 210, 220, 230, 240, and 250 are exemplary and may be modified or varied in accordance with the principles of the present invention. For example, logic block slices 230, 240, and 250 (also labeled and referred to herein as L0, R4, and M4 logic block slices, respectively) are similar to logic block slices 200, 210, and 220, respectively, but further include a routing circuit 224 (e.g., labeled input sharing). Routing circuits 212 and 224 provide, for example, output and input sharing of signals, respectively, within logic block slices 200, 210, 220, 230, 240, and 250 as shown, as would be understood by one skilled in the art.

It should further be understood that routing circuits 212 and/or 224 may be extended to span more than one logic block slice (e.g., logic block slices 200, 210, 220, 230, 240, and 250) to provide common output sharing and/or input sharing, respectively. For example, one routing circuit 224 may be expanded to support and provide input sharing functionality for two or more logic block slices 250 to provide sharing of input signals 214 and/or control signals 216. Furthermore for example, routing circuit 224 may share input signals 214 among logic block slices 250 being supported or may limit one or more of input signals 214 to a subset of the inputs to certain slices 250(1) within the logic block slices 250 being supported. Similarly for example, routing circuit 212 may support and provide output sharing functionality for two or more logic block slices 250 to provide sharing of output signals 218.

As another example, logic block slice 210 may be modified to have only one register 206 (rather than two registers 206) within first slice 210(1) and/or second slice 210(2), which may be referred to herein as an "R2" logic block slice. The "R2" logic block slice may also refer to logic block slice 240 having only one register 206 within first slice 240(1) and/or second slice 240(2). Similarly, logic block slice 220 may be modified to have only one register 206 (rather than two registers 206) within first slice 220(1) and/or second slice 220(2), which may be referred to herein as an "M2" logic block slice. The "M2" logic block slice may also refer to logic block slice 250 having only one register 206 within first slice 250(1) and/or second slice 250(2). The exemplary logic block slices discussed in reference to FIGS. 2a-2f, in general, may provide increased functional flexibility (e.g., logic, ripple (e.g., for arithmetic), and/or RAM), depending upon the logic block slices implemented within the PLD, with logic block slices L0, R2, R4, M2, and M4 arranged roughly in order of offering the least to the most functional flexibility.

It should be noted that the R2 and M2 logic block slices, having a reduced number of registers relative to corresponding R4 and M4 logic block slices, may provide a more optimized and efficient logic block. For example, the R2 and M2 logic block slices may require fewer data and control input ports and associated output ports and reduce the overall number of input/output signals associated with a programmable logic block. Thus, the R2 and M2 logic block slices may reduce the amount of input/output routing circuitry (e.g., input switch box (ISB) and output switch box (OSB) circuitry) of the programmable logic block.

In general, logic block slices 230, 240, and 250 may be optimized with a reduced number of input ports (e.g., twelve) and output ports (e.g., four) along with routing circuits 224 and 212 (e.g., input and output sharing multiplexer circuits) for a desired application. For example, the twelve LUT input signals 214 may represent only sixty percent of an exemplary 16 LUT input signals and four multiplexer input signals that may be provided. Consequently, by reducing the number of input and/or output ports per slice and/or programmable logic block, the amount of global routing (interconnect) may be reduced.

The logic block slices discussed in reference to FIGS. 2a-2f may be used to form a programmable logic block architecture for a PLD in accordance with one or more embodiments of the present invention. For example in accordance with an embodiment of the present invention, the techniques disclosed herein may allow for a smaller die size and more efficient, optimized logic block architecture. As an example, the programmable logic block architecture may be scalable to 200,000 or more LUTs by providing a larger granularity programmable logic block (e.g., 16 or 32 LUTs or more) with an optimized mixture of logic block slice types (e.g., 2 or more types of logic block slices with a percentage allocation of various logic block slice types) and resources to address high density PLD application requirements. A programmable logic block architecture with large granularity may provide certain additional benefits, such as for example minimizing interconnect delay by performing larger functions, reducing the number of logic levels, reducing overall global interconnect resources and optimizing routing resources, reducing overall power requirements, and permitting efficient scaling to higher density PLDs.

For example, FIGS. 3a-3d show block diagrams of exemplary programmable logic blocks 300, 320, 340, and 360, respectively, illustrating exemplary logic block slice implementation details for PLD 100 of FIG. 1 in accordance with an embodiment of the present invention. As an example, programmable logic blocks 300, 320, 340, and 360 may represent exemplary implementations for programmable logic blocks 104 of PLD 100 (FIG. 1).

For example, programmable logic block 300 includes a number of exemplary logic block slices (e.g., eight logic block slices, each having two or more slices) and control logic 302 for programmable logic block 300. Programmable logic block 300 receives input signals 304, which includes for example LUT input signals 214, control signals 216 (e.g., a total of eight programmable logic block level control signals), and various other optional control signals such as four multiplexer control signals per logic block slice. Programmable logic block 300 may also receive carry signals 208 and may provide output signals 306 (e.g., output signals 218) and carry signals 222.

For this exemplary implementation, programmable logic block 300 includes four of logic block slices 210, two of logic block slices 220, and two of logic block slices 200 to provide 32 LUTs and 24 registers, with logic block slices L0 providing no register functionality and logic block slices M4 providing register functionality and distributed memory (e.g., RAM) functionality. Consequently, programmable logic block 300 includes three different logic block slice types, specifically including logic block slice type percentages as shown in Table 1 for embodiment 1, which provides 100% logic, 75% register, 25% distributed memory, and 75% ripple logic block slice type functionality, with approximately 169 input signals and 33 output signals.

In a similar fashion, exemplary implementations are provided for programmable logic blocks 320, 340, and 360 (corresponding to embodiments 2, 3, and 4 in Table 1). Specifically, programmable logic block 320 includes five of logic block slices 210, one of logic block slice 220, and two of logic block slices 200, which provides 100% logic, 75% register, 12.5% distributed memory, and 75% ripple logic block slice type functionality, with approximately 169 input signals and 33 output signals. Programmable logic block 340 includes two of logic block slices 210, four "R2" versions of logic block slices 210, and two of logic block slices 220, which provides 100% logic, 75% register, 25% distributed memory, and approximately 75% ripple logic block slice type functionality, with approximately 169 input signals and 33 output signals. Programmable logic block 360 includes three of logic block slices 210, four "R2" versions of logic block slices 210, and one of logic block slice 220, which provides 100% logic, 75% register, 12.5% distributed memory, and approximately 75% ripple logic block slice type functionality, with approximately 169 input signals and 33 output signals.

Although programmable logic blocks 300, 320, 340, and 360 are illustrated using logic block slices 200, 210, and 220, this is merely exemplary and not limiting and in accordance with one or more embodiments of the present invention a programmable logic block may be implemented with logic block slices or variations of logic block slices selected, for example, from logic block slices 200, 210, 220, 230, 240, and/or 250 as desired (e.g., depending upon the desired mixture of logic block slices and application requirements). Consequently in accordance with one or more embodiments of the present invention, a PLD may be implemented with one type of programmable logic block, as disclosed herein, to provide a homogeneous programmable logic block architecture having large granular logic blocks (e.g., a large number of logic block slices per logic block), with a mixture of logic block slice types, depending upon the application requirements. Alternatively in accordance with one or more embodiments of the present invention, a PLD may be implemented with different types of programmable logic blocks, as disclosed herein, to provide a heterogeneous programmable logic block architecture having large granular logic blocks (e.g., a large number of logic block slices per logic block), with a differing mixture of logic block slice types and number of each logic block slice type, depending upon the application requirements. Furthermore for example, a family of PLD devices may be offered that provides a varying degree of granularity, different types of logic block slices, and/or a varying mixture percentage of logic block slice types within the programmable logic blocks to provide a range of functionality within the family.

TABLE 1

Exemplary Programmable Logic Block Implementations

| | Embodiment 1 | Embodiment 2 | Embodiment 3 | Embodiment 4 |
|---|---|---|---|---|
| Logic Block Slice Types | L0, R4, M4 | L0, R4, M4 | R2, R4, M4 | R2, R4, M4 |
| Logic Block Slice Type Percent Distribution | L0 25% R4 50% M4 25% | L0 25% R4 62.5% M4 12.5% | R2 50% R4 25% M4 25% | R2 50% R4 37.5% M4 12.5% |
| Capability | | | | |
| Logic | 100% | 100% | 100% | 100% |
| Wide gating | 100% | 100% | 100% | 100% |
| Multiplexing | 100% | 100% | 100% | 100% |
| Ripple | 75% | 75% | 75% | 75% |
| Distributed Memory | 25% | 12.5% | 25% | 12.5% |

As noted herein in accordance with one or more embodiments of the present invention, a programmable logic block architecture is disclosed that includes a number of logic block slices, which may be implemented as a number of dual-slice blocks to provide the basic building blocks for each programmable logic block. The dual-slice architecture may provide the silicon efficiency of narrow granularity and the performance of wide gating functions, with an optimized input/output port structure (e.g., input/output sharing and reduction in number of input/output ports compared to one or more conventional approaches). The dual-slice architecture may provide optimal logic block slice architecture and functionality for a desired die size and performance to provide a desired mixture of logic, multiplexing, wide gating, ripple, and/or distributed memory functions.

For example in accordance with one or more embodiments of the present invention, logic block slices 200, 210, and 220 (FIGS. 2a-2c) provide a dual-slice building block with 16 LUT input signals 214 and 4 output signals 218, while logic block slices 230, 240, and 250 (FIGS. 2d-2f) provide a dual-slice building block with 12 LUT input signals 214 and 4 output signals 218. Logic block slices 200, 210, and 220 may be viewed as optimized for performance relative to logic block slices 230, 240, and 250, while logic block slices 230, 240, and 250 may be viewed as optimized for die area (e.g., silicon efficiency) relative to logic block slices 200, 210, and 220.

Figure 4:
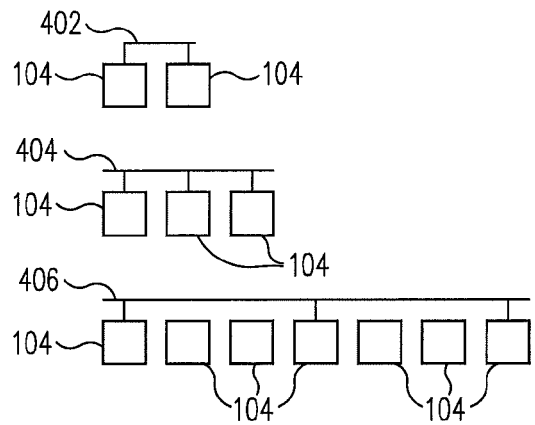
FIG. 4 shows a block diagram illustrating exemplary routing implementations for the programmable logic device of FIG. 1 in accordance with an embodiment of the present invention.

Furthermore in accordance with one or more embodiments of the present invention, routing architectures are disclosed to provide flexible and efficient interconnections for programmable logic blocks (e.g., such as programmable logic blocks 300, 320, 340, and/or 360) having logic block slices (e.g., such as logic block slices 200, 210, 220, 230, 240, and/or 250). For example, FIG. 4 shows a block diagram illustrating exemplary wire types 402, 404, and 406 for exemplary routing implementations for PLD 100 of FIG. 1 in accordance with an embodiment of the present invention. For example, wire types 402, 404, and 406 represent segmented, programmable routing paths for and between programmable logic blocks 104, which may be implemented as discussed herein in reference to FIGS. 3a to 3d.

Wire type 402 (also referred to herein as X1 or segment 1 (seg-1)) provides a routing path between two programmable logic blocks 104 (e.g., spans two programmable logic blocks 104 to provide access or reach from one to another programmable logic block 104). Wire type 404 (also referred to herein as X2 or segment 2 (seg-2)) provides a routing path for three programmable logic blocks 104 (e.g., spans three programmable logic blocks 104 to provide access or reach from one to two other programmable logic blocks 104). Thus, wire type 404 may be viewed as providing mid and end tapped connections.

Wire type 406 (also referred to herein as X6 or segment 6 (seg-6)) provides a routing path among seven programmable logic blocks 104 (e.g., spans seven programmable logic blocks 104 to reach 6 programmable logic blocks 104 and provide access from one to two other programmable logic blocks 104). Thus, wire type 404 also may be viewed as providing mid and end tapped connections. Besides, wire types 402, 404, and 406, there may be for example other wire types, such as an X0 wire type (segment 0 (seg-0), discussed further herein) that provides local routing within programmable logic block 104.

Consequently, various wire types may be provided to provide varying degrees of reach and access and it should be understood that the local and global connections are not limited in any way to those described in reference to FIG. 4. For example, if programmable logic blocks 104 in FIG. 4 each contain 32 LUTs, the wire types provide reach and access to many more LUTs (e.g., four times or more relative to some conventional approaches) due to the larger size block granularity. Therefore, LUT accessibility may be increased relative to conventional approaches and a more flexible, area-efficient routing architecture may be provided.

Figure 5:
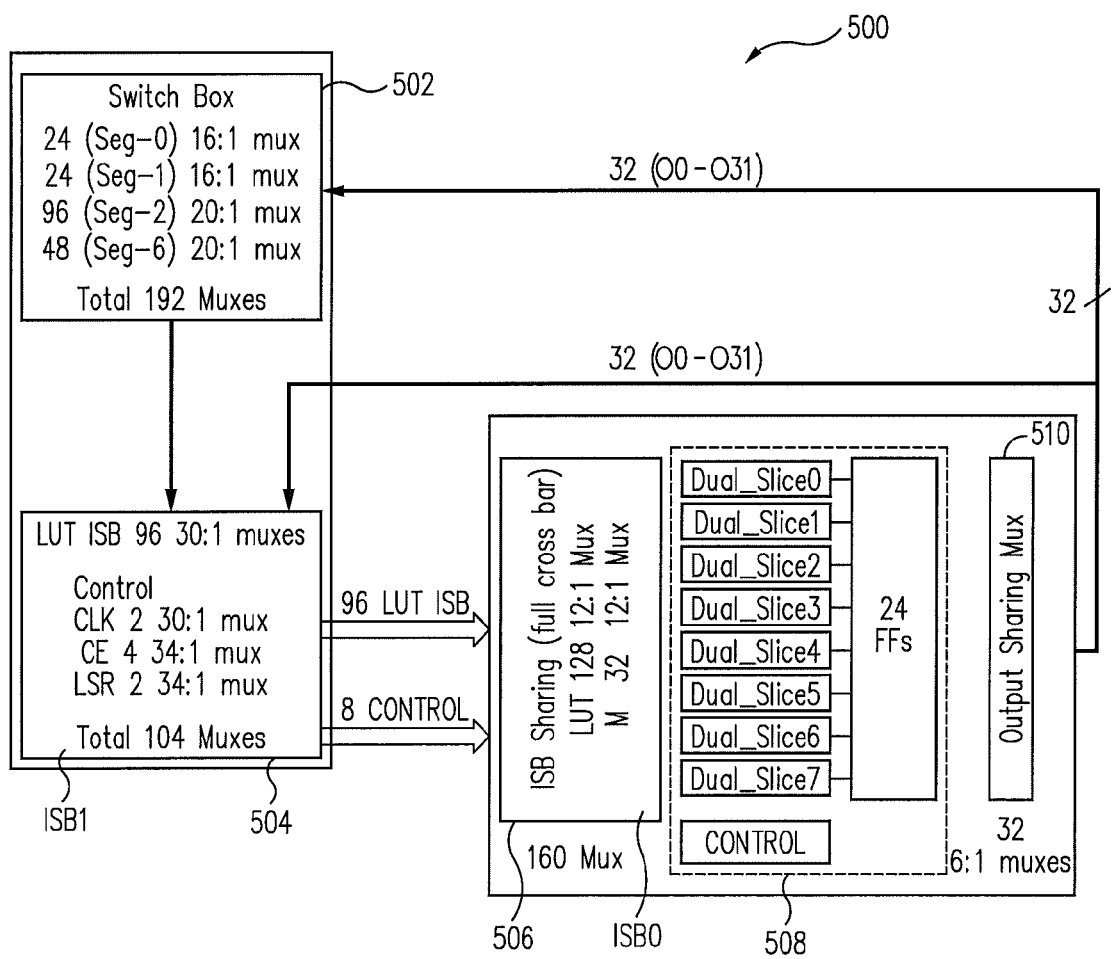
FIG. 5 shows a block diagram illustrating exemplary routing implementations for a programmable logic block of the programmable logic device of FIG. 1 in accordance with an embodiment of the present invention.

For example, FIG. 5 shows a block diagram of a circuit 500, which illustrates an exemplary implementation for a routing architecture for PLD 100 of FIG. 1 in accordance with an embodiment of the present invention. Circuit 500 includes a routing circuit 502, a routing circuit 504, a routing circuit 506, a programmable logic block 508, and a routing circuit 510. Programmable logic block 508 may represent, for example, an exemplary implementation for programmable logic block 104, such as discussed in reference to FIGS. 2 and 3.

Routing circuit 502 (e.g., a switch box) provides global connectivity, in accordance with an embodiment of the present invention, within PLD 100 for programmable logic block 508. For example, routing circuit 502 provides X0, X1, X2, and X6 wire type connectivity (seg-0, seg-1, seg-2, and seg-6, respectively, as discussed in reference to FIG. 4) for programmable logic block 508. As a specific implementation example, routing circuit 502 may include 192 multiplexers to provide 24 seg-0 16:1 multiplexers, 24 seg-1 16:1 multiplexers, 96 seg-2 20:1 multiplexers, and 48 seg-6 20:1 multiplexers.

Routing circuits 504 and 506 may represent, for example, a two-stage input switch box (labeled ISB1 and ISB0, respectively) to provide connectivity to programmable logic block 508 from all local and global routing resources, including routing circuit 502. A two-stage input switch box may result in a reduction of die size and increased routing flexibility, as discussed further herein.

As a specific example, routing circuit 504 may include 104 multiplexers, with 96 30:1 multiplexers to route signals for the LUTs within programmable logic block 508 and 8 multiplexers to route control signals (e.g., two 30:1 multiplexers for two clock signals (CLK), four 34:1 multiplexers for four clock enable signals (CE), and two 34:1 multiplexers for two local set/reset signals (LSR)). Routing circuit 504 routes 96 LUT input signals and 8 control signals to routing circuit 506, for this example, as shown in FIG. 5.

Routing circuit 506 (labeled ISB0, the second stage of the two-stage input switch box) may be implemented, for example, as a full cross bar and include 160 multiplexers, with 128 12:1 multiplexers for routing the LUT input signals and 32 12:1 multiplexers for routing multiplexer control signals. Routing circuit 506 may alternatively be implemented as a partial or half cross bar and still provide adequate connectivity in accordance with some embodiments. Routing circuit 510 (labeled output sharing mux) may represent an exemplary implementation of routing circuit 212 (FIG. 2), with 32 6:1 multiplexers to route output signals from programmable logic block 508 to routing circuits 502 and 504 for feedback paths, local, and global connectivity.

Routing circuits 504 and 506 implemented as a two-stage input switch box may reduce the total number of LUT input signals (e.g., by 40 percent) as compared to some conventional approaches. For example in accordance with an embodiment of the present invention, routing circuit 504 (the first stage) may provide only 12 LUT input signals per logic block slice (e.g., dual slice) with a corresponding reduction in multiplexer size. Routing circuit 506 (the second stage) may be provided as a full cross bar to provide very flexible routing options and, along with routing circuits 504 and 510 may provide local, fast feedback and rich, flexible routing for programmable logic block 508 (e.g., intra-programmable logic block routing).

Figure 6:
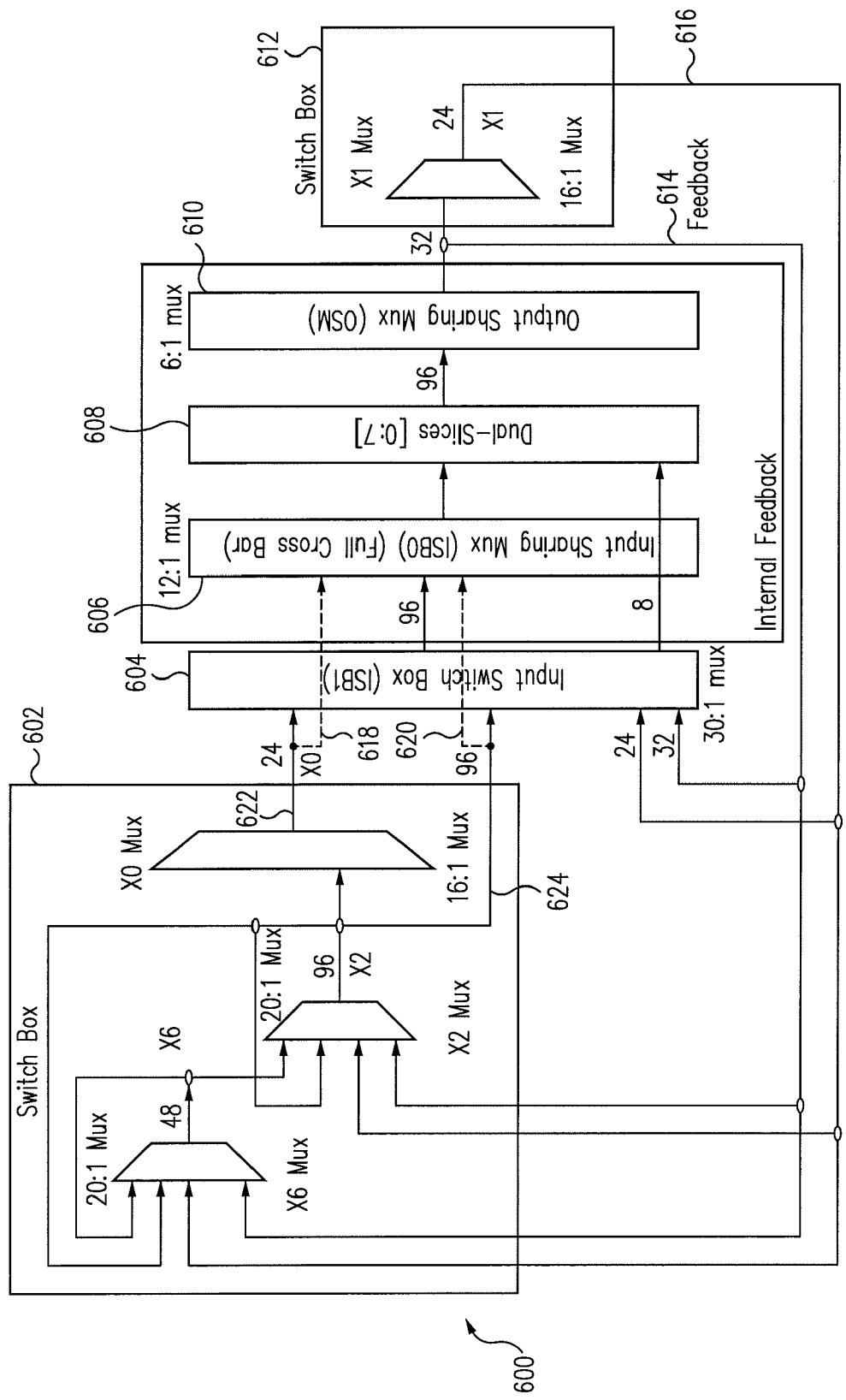
FIG. 6 shows a block diagram illustrating further exemplary routing implementation details for the routing implementation of FIG. 5 in accordance with an embodiment of the present invention.

For example, FIG. 6 shows a block diagram of a circuit 600, which illustrates further exemplary routing implementation details for circuit 500 of FIG. 5 in accordance with an embodiment of the present invention. Circuit 600 includes routing circuits 602, 604, 606, 610, and 612 and a programmable logic block 608.

Routing circuits 602 and 612 may represent an exemplary implementation of routing circuit 502 (FIG. 5). Similarly, routing circuits 604, 606, and 610 may represent exemplary implementations of routing circuits 504, 506, and 510 of FIG. 5, respectively, while programmable logic block 608 may represent an exemplary implementation of programmable logic block 508 (FIG. 5).

As illustrated in FIG. 6, routing circuits 602 and 612 provide local (e.g., X0 and X1) and global (e.g., X2 and X6) wire type connectivity (e.g., as discussed in reference to FIG. 4), which along with routing circuits 604, 606, and 610 may provide a routing architecture and organization that may be optimized to support efficient routability for high density LUT applications and designs (e.g., 200 thousand LUTs or more) for PLDs.

Depending upon the desired application and PLD design, the number and size of the multiplexers within routing circuits 602, 604, 606, 610, and 612 may vary as would be understood by one skilled in the art. Furthermore, the number of feedback and other routing paths may vary, depending upon the desired application. For example, as shown in FIG. 6, 32 output signals (via a feedback path 614) from routing circuit 610 may be fed back to routing circuit 604 in addition to 24 output signals (via a feedback path 616) fed back to routing circuit 604 from routing circuit 612. As another example in accordance with an embodiment of the present invention, paths 618 and 620 may be optionally provided to allow input signals on paths 622 and 624, respectively, to bypass routing circuit 604 (e.g., to increase performance).

Figure 7:
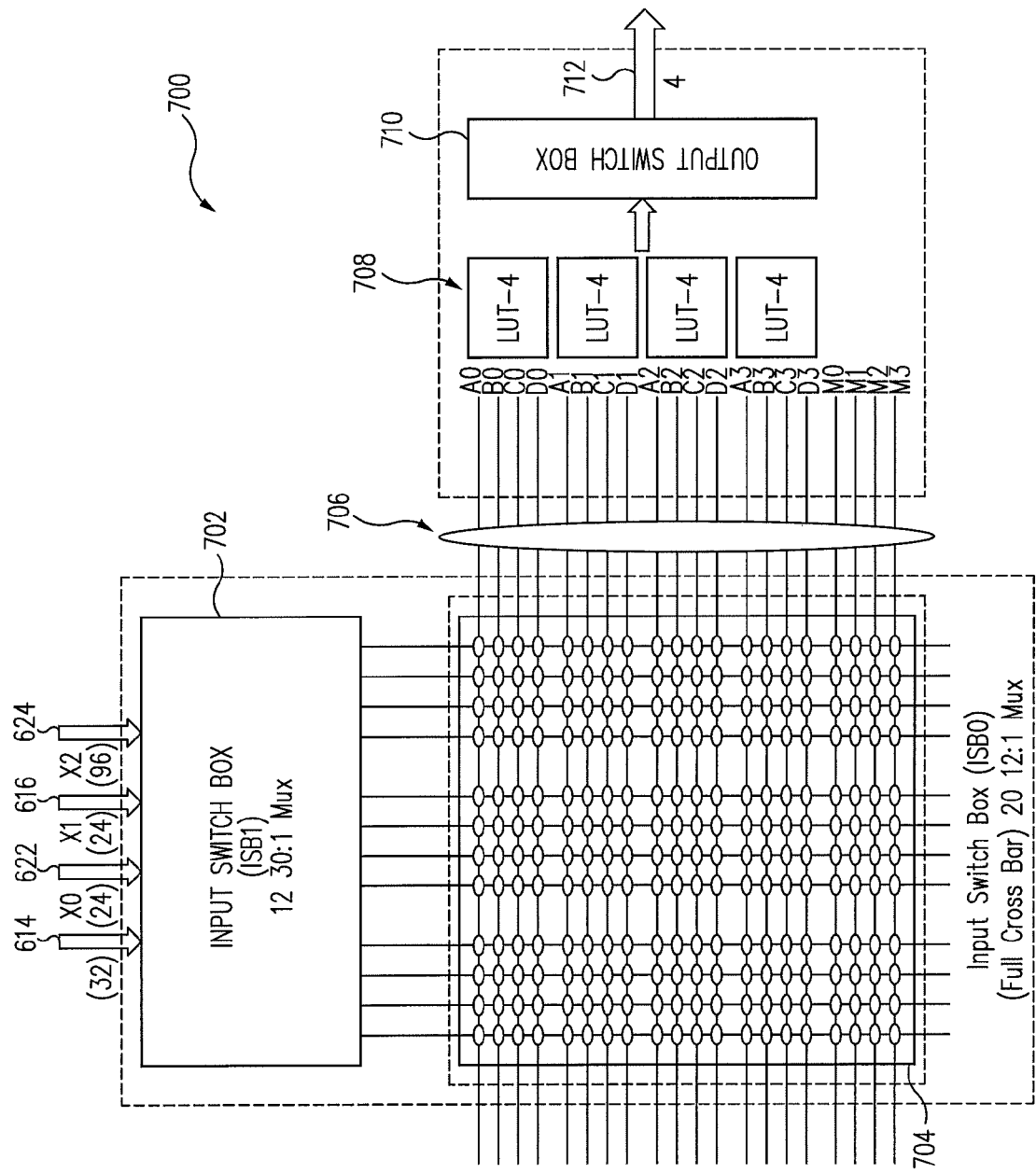
FIG. 7 shows a block diagram illustrating further exemplary routing implementation details for the routing implementation of FIG. 5 in accordance with an embodiment of the present invention.

FIG. 7 shows a block diagram illustrating a circuit 700, which provides further exemplary routing implementation details for circuits 500 and 600 of FIGS. 5 and 6, respectively, in accordance with an embodiment of the present invention. Circuit 700 illustrates the routing of signals on paths 614, 616, 622, and 624 through routing circuits 702 and 704, which are exemplary implementations of routing circuits 604 and 606, respectively, at a logic block slice level (e.g., a dual-slice) for a programmable logic block.

As shown in FIG. 7, routing circuit 702 provides 12 LUT input signals to routing circuit 704. Routing circuit 704 provides (e.g., at an interface 706) 20 signals (e.g., 16 LUT input signals labeled A0-D0 through A3-D3 for LUTs 708 within a programmable logic block slice and four multiplexer control signals labeled M0 through M3). Output signals from LUTs 708 are provided as four output signals 712 from routing circuit 710, which may represent an exemplary implementation of routing circuit 610 at a logic block slice level. For example, circuit 700 illustrates an exemplary routing architecture for one of eight logic block slices (e.g., one of eight dual-slice logic block slices).

Circuit 700 having a two-stage input switch box approach may provide an optimized die size and maximum routing flexibility at a logic block slice level, for a programmable logic block having a number of logic block slices, that is scalable to high density PLD applications. Circuit 702 may be implemented as 12 30:1 multiplexers and circuit 704 may be implemented as 20 12:1 multiplexers, rather than a conventional approach that may require for example 20 70:1 multiplexers. Circuit 704, if implemented as a full cross bar as part of the two stage routing, may maximize routing flexibility and optimize routing at a logic block slice level (e.g., dual slice).

Figure 8:
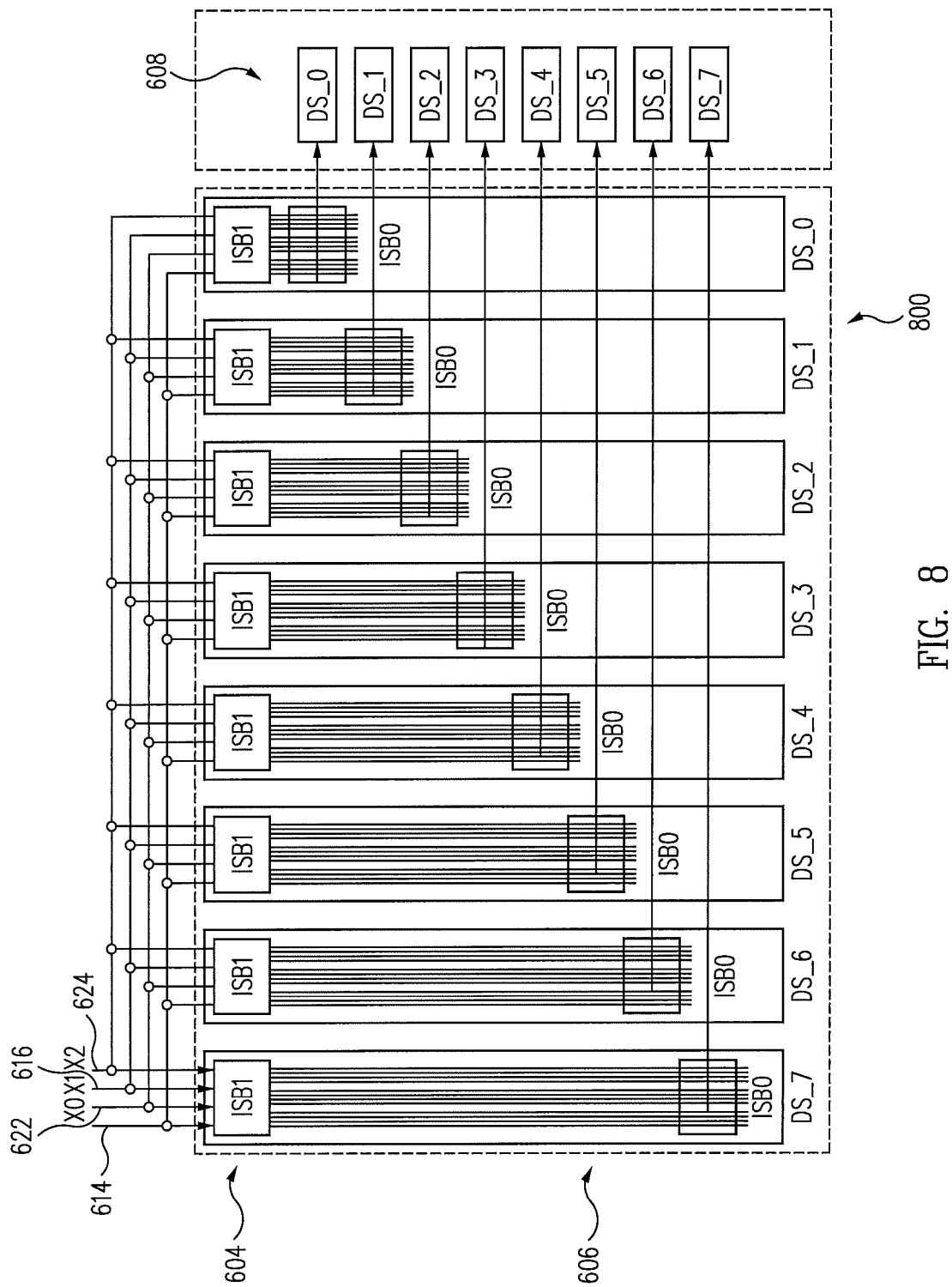
FIG. 8 shows a block diagram illustrating further exemplary routing implementation details for the routing implementation of FIG. 5 in accordance with an embodiment of the present invention.

FIG. 8 shows a block diagram illustrating a circuit 800, which illustrates further exemplary routing implementation details for circuits 500 and 600 of FIGS. 5 and 6, respectively, in accordance with an embodiment of the present invention. Circuit 800 may be viewed as illustrating the exemplary routing architecture of circuit 700, but at a programmable logic block level.

For example, programmable logic block 608 may include eight dual-slice logic block slices (e.g., as discussed in reference to FIGS. 2 and 3), with each logic block slice utilizing a two-stage input switch box or a portion of a two-stage input switch box to receive its corresponding input signals (e.g., 20 input signals per logic block slice). As another example, routing circuit 604, which is shown as a number of individual first stage input switch boxes corresponding to the number of logic block slices (e.g., dual slices or DS), may be implemented as individual switch boxes or as a single first stage input switch box to support all of the logic block slices within programmable logic block 608.

Systems and methods are disclosed herein to provide programmable logic block architectures and routing architectures for the programmable logic blocks. For example, in accordance with an embodiment of the present invention, a routing architecture for a programmable logic block having a number of logic block slices is disclosed. The routing architecture may allow for a reduced die size due to the reduction of the total number of inputs and outputs (ports) allowed for each programmable logic block, with the reduced number of ports allowing a possible reduction in the total number of global wires required for the programmable logic block.

The reduction in the number of global wires may be more beneficial than the slight decrease in efficiency in the number of logic gates in a programmable logic block due to the reduced number of input ports. For example, a programmable logic block that is many times larger than some conventional approaches, while retaining a rich, intra-programmable logic block connectivity, allows more signals to be resolved within the programmable logic block, which also may reduce the number of global wires required.

For example, a routing architecture is disclosed that provides the required flexibility and allows designs to be routed within the PLD even though the total number of switches may be less than in some conventional PLD architectures. The routing architecture may be optimized for area (e.g., for high density FPGAs) and organized, for example, at a logic block slice level (e.g., a dual-slice logic block), with a reduction in the number of ports permitted by sharing signals at the logic block slice level.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device comprising:
a plurality of programmable logic blocks;
a plurality of logic block slices within each of the programmable logic blocks;
an interconnect adapted to provide global routing resources within the programmable logic device;
a first routing circuit, corresponding to each programmable logic block, adapted to provide global signal routing connectivity within the programmable logic device via the interconnect for the corresponding programmable logic block; and
a first input routing circuit, corresponding to each programmable logic block, adapted to receive signals from the first routing circuit and route to the plurality of logic block slices within the corresponding programmable logic block, wherein the first input routing circuit comprises:
a first input switch stage adapted to receive signals from the first routing circuit and provide a subset of the signals for each of the logic block slices, wherein the subset of the signals is less than a number of input ports for lookup tables within the logic block slice; and
a second input switch stage, corresponding to each logic block slice, adapted to receive the corresponding subset of the signals from the first input switch stage and selectively route to the corresponding logic block slice, wherein the second input switch stage is further adapted to receive a first plurality of signals directly from the first routing circuit.

2. The programmable logic device of claim 1, wherein the first input routing circuit comprises a two-stage input switch box and the first routing circuit comprises a switch box having a plurality of multiplexers.

3. The programmable logic device of claim 1, wherein the second input switch stage comprises a full cross bar stage.

4. The programmable logic device of claim 1, further comprising:
an output routing circuit, corresponding to each programmable logic block, adapted to receive output signals from the logic block slices within the corresponding programmable logic block and route the output signals directly to the first routing circuit and the first input routing circuit.

5. A programmable logic device comprising:
a plurality of programmable logic blocks;
a plurality of logic block slices within each of the programmable logic blocks;
an interconnect adapted to provide global routing resources within the programmable logic device;
a first routing circuit, corresponding to each programmable logic block, adapted to provide global signal routing connectivity within the programmable logic device via the interconnect for the corresponding programmable logic block; and
a first input routing circuit, corresponding to each programmable logic block, adapted to receive signals from the first routing circuit and route to the plurality of logic block slices within the corresponding programmable logic block, wherein the first input routing circuit comprises:
a first input switch stage adapted to receive signals from the first routing circuit and provide a subset of the signals for each of the logic block slices; and
a second input switch stage, corresponding to each logic block slice, adapted to receive the corresponding subset of the signals from the first input switch stage and selectively route to the corresponding logic block slice, wherein the second input switch stage is further adapted to receive a first plurality of signals directly from the first routing circuit,
wherein each of the logic block slices comprises at least a first and a second slice each having at least a first lookup table, with the programmable logic blocks each comprising at least a first logic block slice, a second logic block slice, and a third logic block slice; and
wherein the first logic block slice is a logic block slice type different from the second logic block slice, and the third logic block slice is a logic block slice type different from the first and second logic block slices.

6. A programmable logic device comprising:
a plurality of programmable logic blocks;
a plurality of logic block slices within each of the programmable logic blocks;
an interconnect adapted to provide global routing resources within the programmable logic device;
a first routing circuit, corresponding to each programmable logic block, adapted to provide global signal routing connectivity within the programmable logic device via the interconnect for the corresponding programmable logic block; and
a first input routing circuit, corresponding to each programmable logic block, adapted to receive signals from the first routing circuit and route to the plurality of logic block slices within the corresponding programmable logic block, wherein the first input routing circuit comprises:
a first input switch stage adapted to receive signals from the first routing circuit and provide a subset of the signals for each of the logic block slices; and
a second input switch stage, corresponding to each logic block slice, adapted to receive the corresponding subset of the signals from the first input switch stage and selectively route to the corresponding logic block slice, wherein the second input switch stage is further adapted to receive a first plurality of signals directly from the first routing circuit, wherein the programmable logic blocks are homogeneous within the programmable logic device.

7. A programmable logic device comprising:
a plurality of programmable logic blocks;
a plurality of logic block slices within each of the programmable logic blocks;
an interconnect adapted to provide global routing resources within the programmable logic device;
a first routing circuit, corresponding to each programmable logic block, adapted to provide global signal routing connectivity within the programmable logic device via the interconnect for the corresponding programmable logic block; and
a first input routing circuit, corresponding to each programmable logic block, adapted to receive signals from the first routing circuit and route to the plurality of logic block slices within the corresponding programmable logic block, wherein the first input routing circuit comprises:
 a first input switch stage adapted to receive signals from the first routing circuit and provide a subset of the signals for each of the logic block slices; and
 a second input switch stage, corresponding to each logic block slice, adapted to receive the corresponding subset of the signals from the first input switch stage and selectively route to the corresponding logic block slice, wherein the second input switch stage is further adapted to receive a first plurality of signals directly from the first routing circuit,
wherein the programmable logic blocks are heterogeneous within the programmable logic device.

8. A programmable logic device comprising:
a plurality of programmable logic blocks;
a plurality of logic block slices within each of the programmable logic blocks;
an interconnect adapted to provide global routing resources within the programmable logic device;
a first routing circuit, corresponding to each programmable logic block, adapted to provide global signal routing connectivity within the programmable logic device via the interconnect for the corresponding programmable logic block; and
a first input routing circuit, corresponding to each programmable logic block, adapted to receive signals from the first routing circuit and route to the plurality of logic block slices within the corresponding programmable logic block, wherein the first input routing circuit comprises:
 a first input switch stage adapted to receive signals from the first routing circuit and provide a subset of the signals for each of the logic block slices; and
 a second input switch stage, corresponding to each logic block slice, adapted to receive the corresponding subset of the signals from the first input switch stage and selectively route to the corresponding logic block slice, wherein the second input switch stage is further adapted to receive a first plurality of signals directly from the first routing circuit,
wherein the logic block slices each comprise a dual-slice architecture, and wherein a first logic block slice comprises a plurality of lookup tables but no registers or RAM functionality, a second logic block slice comprises a plurality of registers and a plurality of lookup tables but no RAM functionality, and a third logic block slice comprises a plurality of registers and a plurality of lookup tables adapted to provide RAM functionality.

9. The programmable logic device of claim 1, further comprising:
a volatile memory block adapted to store information during operation of the programmable logic device;
configuration memory adapted to configure the programmable logic device;
a non-volatile memory block adapted to store configuration data for transfer to the configuration memory to configure the programmable logic blocks;
input/output blocks adapted to transfer information into and out of the programmable logic device; and
wherein the interconnect is configured based on the configuration data stored in the configuration memory and is adapted to provide routing resources between the volatile memory block, the input/output blocks, and the programmable logic blocks.

10. A programmable logic device comprising:
a plurality of programmable logic blocks;
a plurality of logic block slices within each of the programmable logic blocks;
means for globally routing signals within the programmable logic device for the programmable logic blocks;
means, corresponding to each programmable logic block, for providing global signal routing connectivity to the global routing means; and
means, corresponding to each programmable logic block, for routing in a first and a second stage signals from the providing means to the plurality of logic block slices within the corresponding programmable logic block, wherein the routing means is further adapted to route the signals directly to the second stage by bypassing the first stage,
wherein the programmable logic blocks are heterogeneous within the programmable logic device.

11. The programmable logic device of claim 10, wherein the signals provided from the first stage to the second stage of the routing means for each of the plurality of logic block slices is less than a number of input ports for lookup tables within each of the logic block slices.

12. The programmable logic device of claim 10, further comprising means, corresponding to each programmable logic block, for routing output signals from the logic block slices within the corresponding programmable logic block directly to the providing means and the routing means.

13. The programmable logic device of claim 10, wherein each of the logic block slices comprises at least a first and a second slice each having at least a first lookup table, with the programmable logic blocks each comprising at least a first logic block slice, a second logic block slice, and a third logic block slice;
 wherein the first logic block slice is a logic block slice type different from the second logic block slice, and the third logic block slice is a logic block slice type different from the first and second logic block slices; and
 wherein the first logic block slice comprises a plurality of lookup tables but no registers or RAM functionality, the second logic block slice comprises a plurality of registers and a plurality of lookup tables but no RAM functionality, and the third logic block slice comprises a plurality of registers and a plurality of lookup tables adapted to provide RAM functionality.

14. The programmable logic device of claim 10, further comprising:
a volatile memory block adapted to store information during operation of the programmable logic device;
configuration memory adapted to configure the programmable logic device;

a non-volatile memory block adapted to store configuration data for transfer to the configuration memory to configure the programmable logic blocks;

input/output blocks adapted to transfer information into and out of the programmable logic device; and wherein the global routing means is configured based on the configuration data stored in the configuration memory and is adapted to provide routing resources between the volatile memory block, the input/output blocks, and the programmable logic blocks.

15. A method for providing a routing architecture within a programmable logic device, the method comprising:

providing a plurality of programmable logic blocks;

providing at least a first logic block slice, a second logic block slice, and a third logic block slice within each of the programmable logic blocks, with the first, second, and third logic block slices each of a different logic block slice type, and wherein the first logic block slice comprises a plurality of lookup tables but no registers or RAM functionality, the second logic block slice comprises a plurality of registers and a plurality of lookup tables but no RAM functionality, and the third logic block slice comprises a plurality of registers and a plurality of lookup tables adapted to provide RAM functionality;

providing an interconnect to provide global routing resources within the programmable logic device;

providing a first routing circuit for each programmable logic block to provide signal routing connectivity within the programmable logic device locally for the programmable logic block and to other ones of the programmable logic blocks via the interconnect;

providing a two-stage routing circuit for each programmable logic block for routing signals from the first routing circuit to the logic block slices within the corresponding programmable logic block; and providing an output routing circuit for routing output signals from the logic block slices within the corresponding programmable logic block directly to the first routing circuit and the two-stage routing circuit.

16. The method of claim 15, further comprising receiving, by a second stage of the two-stage routing circuit, a first plurality of signals directly from the first routing circuit.

17. The programmable logic device of claim 5, wherein the first input routing circuit comprises a two-stage input switch box and the first routing circuit comprises a switch box having a plurality of multiplexers.

18. The programmable logic device of claim 6, wherein the first input routing circuit comprises a two-stage input switch box and the first routing circuit comprises a switch box having a plurality of multiplexers.

19. The programmable logic device of claim 7, wherein the first input routing circuit comprises a two-stage input switch box and the first routing circuit comprises a switch box having a plurality of multiplexers.

20. The programmable logic device of claim 8, wherein the first input routing circuit comprises a two-stage input switch box and the first routing circuit comprises a switch box having a plurality of multiplexers.

* * * * *

UNITED STATES PATENT AND TRADEMARK OFFICE
CERTIFICATE OF CORRECTION

PATENT NO.         : 7,605,606 B1                                          Page 1 of 1
APPLICATION NO. : 11/498646
DATED              : October 20, 2009
INVENTOR(S)        : Ding et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 125 days.

Signed and Sealed this

Fifth Day of October, 2010

David J. Kappos
*Director of the United States Patent and Trademark Office*